United States Patent
He et al.

(10) Patent No.: US 9,343,567 B2
(45) Date of Patent: May 17, 2016

(54) SEMICONDUCTOR DEVICE

(71) Applicant: UNITED MICROELECTRONICS CORP., Hsin-Chu (TW)

(72) Inventors: Yi-Ning He, Taichung (TW); Jhih-Ming Wang, Yunlin County (TW); Lu-An Chen, Hsinchu County (TW); Tien-Hao Tang, Hsinchu (TW); Kuan-Cheng Su, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 57 days.

(21) Appl. No.: 14/454,739

(22) Filed: Aug. 8, 2014

(65) Prior Publication Data

US 2016/0043216 A1    Feb. 11, 2016

(51) Int. Cl.
*H01L 29/78* (2006.01)
*H01L 29/06* (2006.01)
*H01L 29/08* (2006.01)
*H01L 27/02* (2006.01)
*H01L 29/10* (2006.01)

(52) U.S. Cl.
CPC ........ *H01L 29/7816* (2013.01); *H01L 27/0248* (2013.01); *H01L 27/0262* (2013.01); *H01L 29/0692* (2013.01); *H01L 29/0873* (2013.01); *H01L 29/0882* (2013.01); *H01L 29/0886* (2013.01); *H01L 29/0653* (2013.01); *H01L 29/0878* (2013.01); *H01L 29/1083* (2013.01)

(58) Field of Classification Search
CPC ............ H01L 29/7816; H01L 29/0692; H01L 29/0878; H01L 29/0882; H01L 29/0873; H01L 29/0886; H01L 27/0248; H01L 27/0262
See application file for complete search history.

(56) References Cited

U.S. PATENT DOCUMENTS

| | | | |
|---|---|---|---|
| 7,910,951 B2 | 3/2011 | Vashchenko | |
| 8,283,727 B1 | 10/2012 | Walker et al. | |
| 8,530,969 B2 | 9/2013 | Chen et al. | |
| 2013/0277742 A1* | 10/2013 | Lee | H01L 29/7816 257/343 |

* cited by examiner

*Primary Examiner* — Thanhha Pham
(74) *Attorney, Agent, or Firm* — Winston Hsu; Scott Margo

(57) ABSTRACT

A semiconductor device is includes a substrate, a gate positioned on the substrate, and a drain region and a source region formed at two respective sides of the gate in the substrate. The drain region includes a first doped region having a first conductivity type, a second doped region having a second conductivity type, and a third doped region. The first conductivity type and the second conductivity type are complementary to each other. The semiconductor device further includes a first well region formed under the first doped region, a second well region formed under the second doped region, and a third well region formed under the third doped region. The first well region, the second well region, and the third well region all include the first conductivity type. A concentration of the second well region is different from a concentration of the third well region.

28 Claims, 6 Drawing Sheets

SEMICONDUCTOR DEVICE

BACKGROUND OF THE INVENTION

1. Field of the Invention

The invention relates to a semiconductor device, and more particularly, to an electrostatic discharge (hereinafter abbreviated as ESD) protection semiconductor device.

2. Description of the Prior Art

Chips and/or Integrated circuits (ICs) are the most essential hardware foundation of the modern information society. As products based on ICs become more delicate, they also become more vulnerable to impacts from external environment. For example, it is found that ESD is a constant threat to modern electronics.

Generally considered ESD has two modes: human body mode (HBM) and machine mode (MM). In the human body mode, static electricity is discharged from human body to a semiconductor device when a user touches a body part of the semiconductor device. Static electricity discharged from a human body to a device typically has a high voltage of about 2000V and is discharged through great impedance. Another source of ESD is from metallic objects, known as the machine mode, is characterized by a greater capacitance and lower internal resistance than the HBM ESD source. The result of ESD on unprotected ICs is often destruction, characterized by melting or explosion of a part of the ICs. Therefore, the ESD protection devices are taken as important components of the protection circuitry provided in today's electronic devices.

Various approaches have been made to provide ESD protection device associated with IC interface pads to prevent a core circuit of the ICs from the ESD damages. Typically, during a normal IC operation, the ESD protection device is turned off. However when an ESD event occurs, the ESD surges will cause the ESD protection device to breakdown and create a substrate current path, through which the ESD current is diverted to ground and thus the core circuit is protected. Therefore, it is conceivable that if the ESD protection device can be quickly triggered, it will be better to bypass the ESD current from the core circuit.

There is therefore a continuing need in the semiconductor processing art to develop an ESD protection device having lower trigger voltage which can be quickly turned on in order to render immediate protection to the core circuit. Furthermore, it is found that the trigger voltage of the ESD protection device is related to the substrate resistance (hereinafter abbreviated as $R_{sub}$): Small $R_{sub}$ leads to a higher trigger voltage which is undesirable to the ESD protection device. In view of the above, there exists a need for the ESD protection device having increased $R_{sub}$ that results in reduced trigger voltage.

SUMMARY OF THE INVENTION

According to the claimed invention, a semiconductor device is provided. The semiconductor device includes a substrate, a gate positioned on the substrate, and a drain region and a source region formed at two respective sides of the gate in the substrate. The drain region further includes a first doped region having a first conductivity type, a second doped region having a second conductivity type, and a third doped region. The first conductivity type and the second conductivity type are complementary to each other. The semiconductor device further includes a first well region formed under the first doped region, a second well region formed under the second doped region, and a third well region formed under the third doped region. The first well region, the second well region and the third well region all include the first conductivity type. A concentration of the second well region is different from a concentration of the third well region.

According to the claimed invention, another semiconductor device is provided. The semiconductor device includes a substrate, a gate positioned on the substrate, and a drain region and a source region formed at two respective sides of the gate in the substrate. The drain region further includes a first doped region having a first conductivity type, a second doped region having a second conductivity type, and a third doped region. The first conductivity type and the second conductivity type are complementary to each other. The semiconductor device further includes a first well region formed under the first doped region, a second well region formed under the second doped region, and a third well region formed under the third doped region. The first well region, the second well region and the third well region all include the first conductivity type. A concentration of the second well region is the same with a concentration of the third well region, and the concentrations of the second well region and the third well region are different from a concentration of the first well region.

According to the claimed invention, still another semiconductor device is provided. The semiconductor device includes a substrate, a gate positioned on the substrate, a drain region and a source region formed at two respective sides of the gate in the substrate. The drain region further includes a first doped region having a first conductivity type, a second doped region having a second conductivity type, and a third doped region. The first conductivity type and the second conductivity type are complementary to each other. The semiconductor device further includes a first well region formed under the first doped region, a second well region formed under the second doped region, and a third well region formed under the third doped region. The first well region, the second well region and the third well region all include the first conductivity type. At least one of the second well region and the third well region comprises a concentration lower than a concentration of the first well region.

According to the semiconductor devices provided by the present invention, the well regions formed under the drain region include the same conductivity type, but the well regions include at least two different concentrations. It is found that $R_{sub}$ is conspicuously increased thereby, and thus the trigger voltage of the semiconductor device is desirably reduced. Consequently, the semiconductor device can be quickly turned on for rendering immediate ESD protection to the core circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
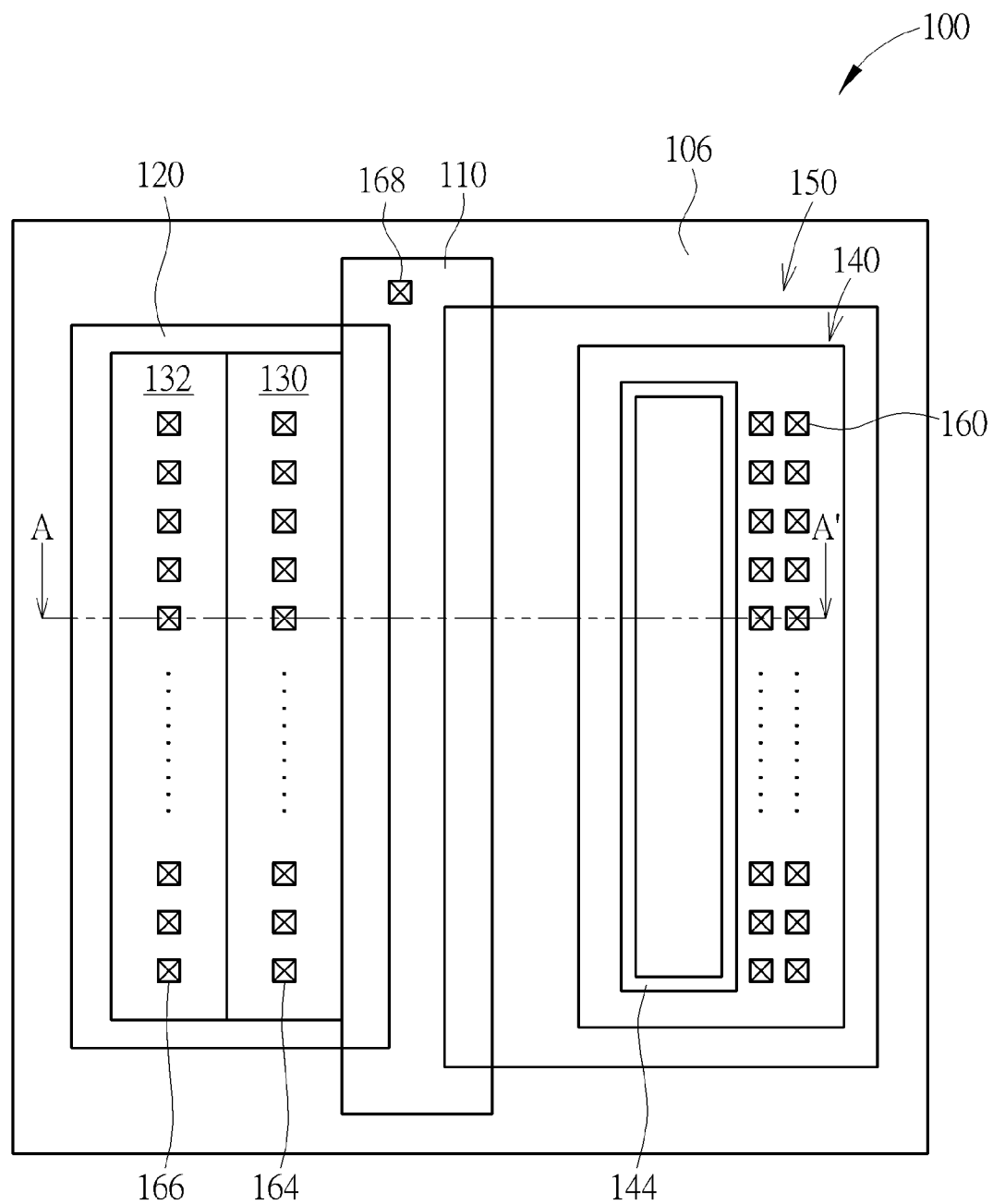
FIG. 1 is a schematic drawing illustrating a semiconductor device including a REGION 1 and a REGION 2 provided by a first preferred embodiment of the present invention.
Figure 2:
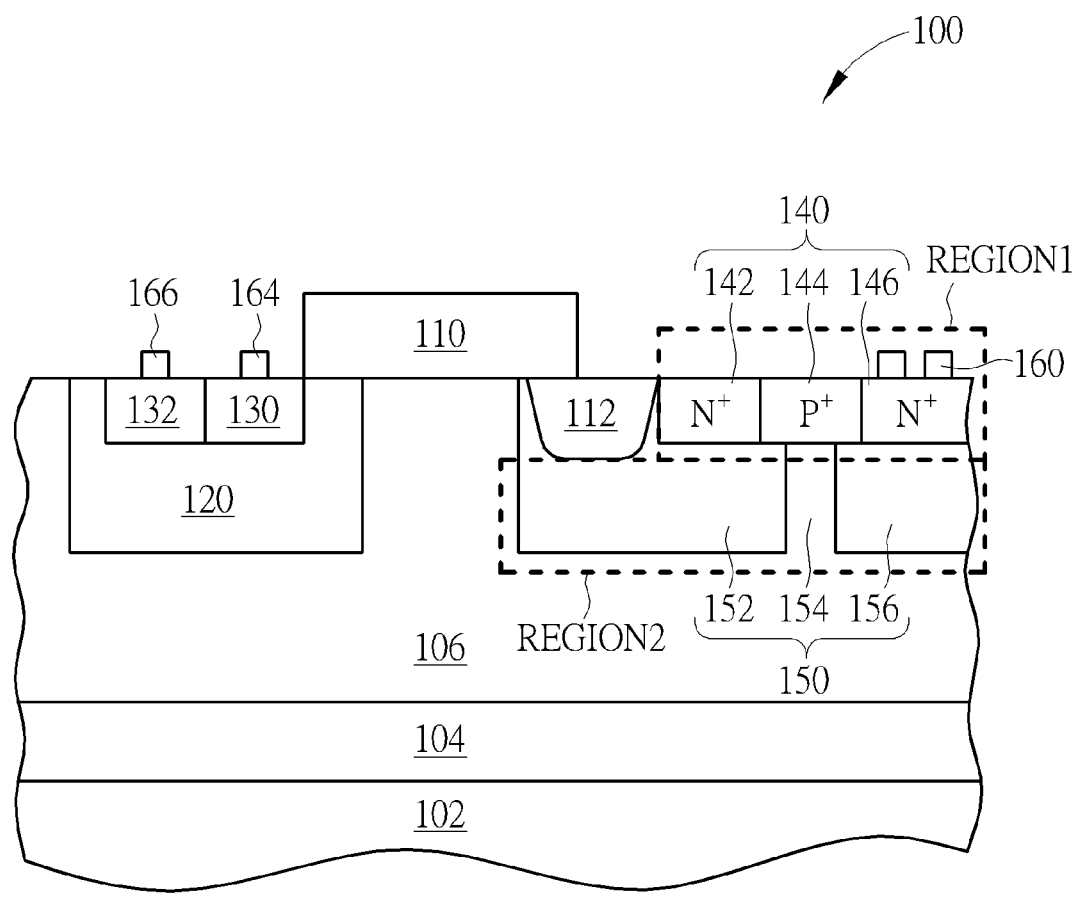
FIG. 2 is a cross-sectional view take along Line A-A' of FIG. 1.

Please refer to FIGS. 1-2, wherein FIG. 1 is a schematic drawing illustrating a semiconductor device provided by a first preferred embodiment of the present invention, and FIG. 2 is a cross-sectional view take along Line A-A' of FIG. 1. As shown in FIGS. 1 and 2, a semiconductor device 100 provided by the preferred embodiment includes a substrate 102 (shown in FIG. 2). A buried layer 104 (shown in FIG. 2) is formed on the substrate 102, and a deep well region 106 is formed on the buried layer 104. The buried layer 104 and the deep well region 106 include a first conductive type and the substrate 102 includes a second conductive type. The first conductivity type and the second conductivity type are complementary to each other. According to the preferred embodiment, the first conductive type is n type and the second conductive type is p type. Therefore the device 100 provided by the preferred embodiment is an n-typed semiconductor device 100 positioned in an n-typed deep well region 106 on an n-typed buried layer (NBL) 104 in a p-typed semiconductor substrate 102. However, those skilled in the art would easily realize that the first conductivity type can be p type and the second conductivity type can be n type in other preferred embodiment.

Please still refer to FIGS. 1-2. The semiconductor device 100 provided by the preferred embodiment includes a gate 110 and an isolation structure 112 such as a shallow trench isolation (STI) and a gate dielectric layer formed on the substrate 102, particularly in the deep well region 106, and the gate 110 covers a portion of the isolation structure 112. It is noteworthy that for clarifying the spatial relationship between the gate 110 and other elements, the isolation structure 112 is omitted from FIG. 1.

Please refer to FIGS. 1-2 again. The semiconductor device 100 further includes a body region 120 formed in the deep well region 106. The body region 120 includes the second conductivity type and thus is a p-typed body region 120 in the preferred embodiment. The semiconductor device 100 further includes a source region 130 and a doped region 132 abutting to the source region 130 formed in the body region 120. The source region 130 includes the first conductivity type and the doped region 132 includes the second conductivity type, and thus is an n-typed source region 130 and a p-typed doped region 132. The semiconductor device 100 further includes a drain region 140. Furthermore, the drain region 140 includes a first doped region 142, a second doped region 144 and a third doped region 146. The first doped region 142 and the third doped region 144 include the first conductivity type while the second doped region 144 includes the second conductivity type. More important, the first doped region 142 and the third doped region 146 form a hollow shaped structure with the second doped region 144 formed therein as shown in FIG. 1. In other words, the second doped region 144 is sandwiched between the first doped region 142 and the third doped region 146 in substrate-horizontal directions.

Please still refer to FIGS. 1 and 2. The semiconductor device 100 provided by the preferred embodiment further includes a drift region 150, and the drift region 150 includes a first well region 152 formed under the first doped region 142 and the isolation structure 112, a second well region 154 formed under the second doped region 144, and a third well region 156 formed under the third doped region 146. In the preferred embodiment, the first well region 152, the second well region 154 and the third well region 156 all include the first conductivity type. A concentration of the first well region 152 is the same with a concentration of the third well region 156. But the concentrations of the first well region 152 and the third well region 156 are higher than a concentration of the second well region 154 while the concentration of the second well region 154 is the same with a concentration of the deep well region 106. More important, the first well region 152 and the third well region 156 form a hollow shaped structure with the second well region 154 formed therein as shown in FIG. 1. In other words, the second well region 154 is sandwiched between the first well region 152 and the third well region 156 in substrate-horizontal directions.

Additionally, a plurality of first contacts 160 are formed in the third doped region 146 of the drain region 140 and electrically connected to the third doped region 146, a plurality of source contacts 164 are formed in the source region 130 and electrically connected to the source region 130, a plurality of doped region contacts 166 are formed in the doped region 132 and electrically connected to the doped region 132, and at least a gate contact 168 is formed on the gate 110 and electrically connected to the gate 110. Those skilled in the art would easily realize that amounts of the first contacts 160, the source contacts 164, the doped region contacts 166, and the gate contact 168 are adjustable depending on different product requirements, thus those details are omitted for simplicity.

According to the semiconductor device 100 provided by the first preferred embodiment, the drift region 150 is formed by the first well region 152 under the first doped region 142, the second well region 154 under the second doped region 144, and the third well region 156 under the third doped region 146. More important, the second well region 154 sandwiched between the first region 152 and the third well region 156 includes the concentration lower than the first region 152 and the third well region 156, and thus resulted in an increased $R_{sub}$ in the drift region 150. Consequently, the trigger voltage of the semiconductor device 100 is reduced without impacting other specification such as the breakdown voltage of the semiconductor device 100.

Please refer to FIG. 2 again. It is conceivable that the drain side of the semiconductor device provided by the present invention includes a specific structure. In detail, the drain side of the semiconductor device includes a REGION 1 and a REGION 2 formed under REGION 1 and the isolation structure 112. More important, REGION 1 is formed by the first doped region 142, the second doped region 144, and the third doped region 146. In other words, REGION 1 can be taken as the drain region 140. REGION 2 is formed by the first well region 152 (correspondingly under the first doped region 142 and the isolation structure 112), the second well region 154 (correspondingly under the second doped region 144), and the third well region 156 (correspondingly under the third doped region 146). In other words, REGION 2 can be taken as the drifting region 150.

The details about REGION 1 and REGION 2 will be individually discussed. It is noteworthy that though only REGION 1 and REGION 2 are detailed, those skilled in the art would easily realize placements and spatial relationships between other elements according to the above disclosure. And thus those details are omitted in the interest of brevity. Furthermore, elements the same in the following embodiments and the first preferred embodiment are designated by the same numerals. Please refer to FIG. 2, in the first preferred embodiment of REGION 1, REGION 1 includes the first doped region 142 and the third doped region 146 having the first conductivity type and the concentrations of the first doped region 142 and the third doped region being the same. REGION 1 also includes the second doped region 144 having the second conductivity type. In the first preferred embodiment, a plurality of the first contacts 160 are only formed in the third doped region 146 and electrically connected to the third doped region 146.

Figure 3A:
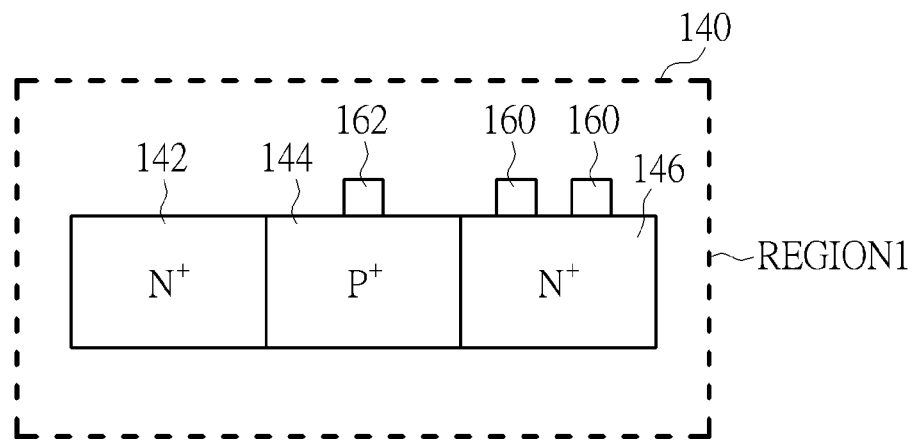
FIG. 3A is a schematic drawing illustrating the REGION 1 of a semiconductor device provided by a second preferred embodiment of the present invention.

Please refer to FIGS. 3A-3E, which are schematic drawings illustrating the REGION 1 of a semiconductor device provided by a second to a sixth preferred embodiments of the present invention. As shown in FIG. 3A, REGION 1 of the second preferred embodiment also includes a first doped region 142 and a third doped region 146 having the first conductivity type and the concentrations of the first doped region 142 and the third doped region 146 being the same. REGION 1 also includes the second doped region 144 having the second conductivity type. In fact, the first doped region 142 and the third doped region 146 form a hollow shaped structure with the second doped region 144 formed therein as shown in FIG. 1. In other words, the second doped region 144 is sandwiched between the first doped region 142 and the third doped region 146. In the second preferred embodiment for REGION 1, a plurality of the first contacts 160 are formed in the third doped region 146 and electrically connected to the third doped region 146, and at least a second contact 162 is formed in the second doped region 144 and electrically connected to the second doped region 144.

Figure 3B:
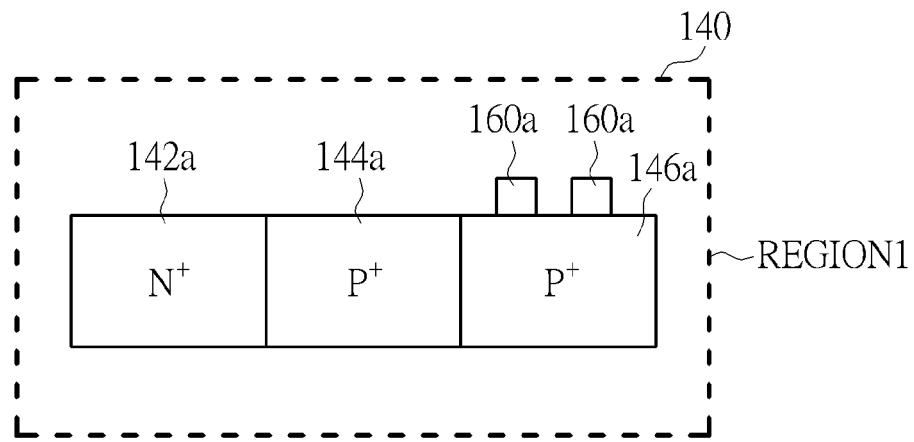
FIG. 3B is a schematic drawing illustrating the REGION 1 of a semiconductor device provided by a third preferred embodiment of the present invention.

Please refer to FIG. 3B, which illustrates REGION 1 provided by the third preferred embodiment. REGION 1 of the third preferred embodiment includes a first doped region 142$a$ having the first conductivity type, and a second doped region 144$a$ and a third doped region 146$a$ having the second conductivity type. Concentrations of the second doped region 144$a$ and the third doped region 146$a$ are the same. In the third preferred embodiment for REGION 1, a plurality of first contacts 160$a$ are only formed in the third doped region 146$a$ and electrically connected to the third doped region 146$a$.

Figure 3C:
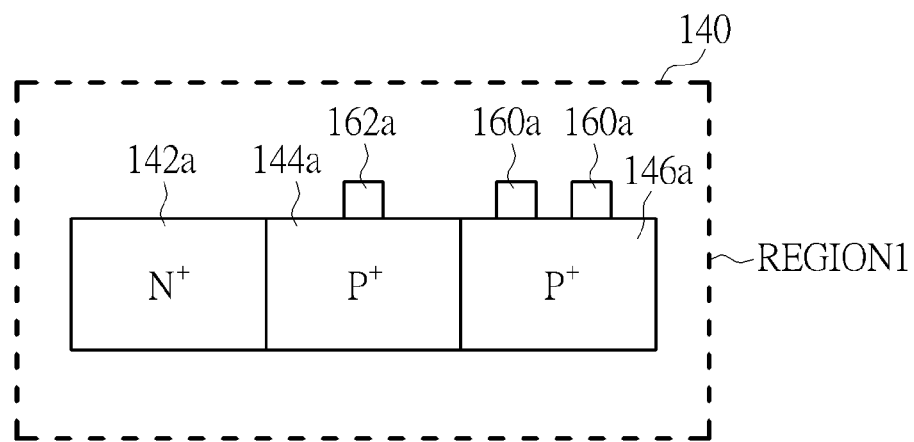
FIG. 3C is a schematic drawing illustrating the REGION 1 of a semiconductor device provided by a fourth preferred embodiment of the present invention.

Please refer to FIG. 3C, which illustrates REGION 1 provided by the fourth preferred embodiment. REGION 1 of the fourth preferred embodiment includes a first doped region 142$a$ having the first conductivity type, and a second doped region 144$a$ and a third doped region 146$a$ having the second conductivity type. And concentrations of the second doped region 144$a$ and the third doped region 146$a$ are the same. In the fourth preferred embodiment for REGION 1, a plurality of first contacts 160$a$ are formed in the third doped region 146$a$ and electrically connected to the third doped region 146$a$, and at least a second contact 162$a$ is formed in the second doped region 144$a$ and electrically connected to the second doped region 144$a$.

Figure 3D:
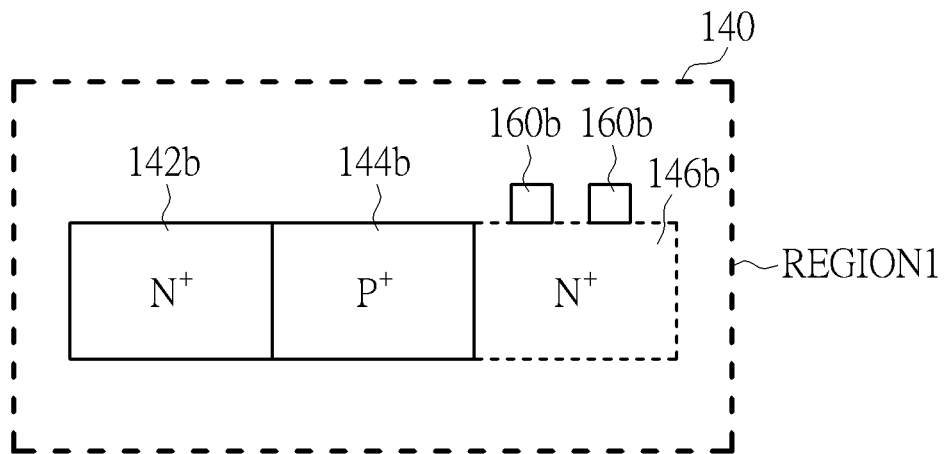
FIG. 3D is a schematic drawing illustrating the REGION 1 of a semiconductor device provided by a fifth preferred embodiment of the present invention.

Please refer to FIG. 3D, which illustrates REGION 1 provided by the fifth preferred embodiment. REGION 1 of the fifth preferred embodiment includes a first doped region 142$b$ having the first conductivity type, a second doped region 144$b$ having the second conductivity, and a third doped region 146$b$ having the first conductivity type. It is noteworthy that a concentration of the third doped region 146$b$ is lower than a concentration of the first doped region 142$b$. Furthermore, the concentration of the third doped region 146$b$ can equal to or lower than a concentration of the drift region 150, even equal to a concentration of the deep well region 106. Thus the third doped region 146$b$ of the fifth preferred embodiment is depicted by a dotted line. In the fifth preferred embodiment for REGION 1, a plurality of first contacts 160$b$ are formed in the third doped region 146$b$ and electrically connected to the third doped region 146$b$.

Figure 3E:
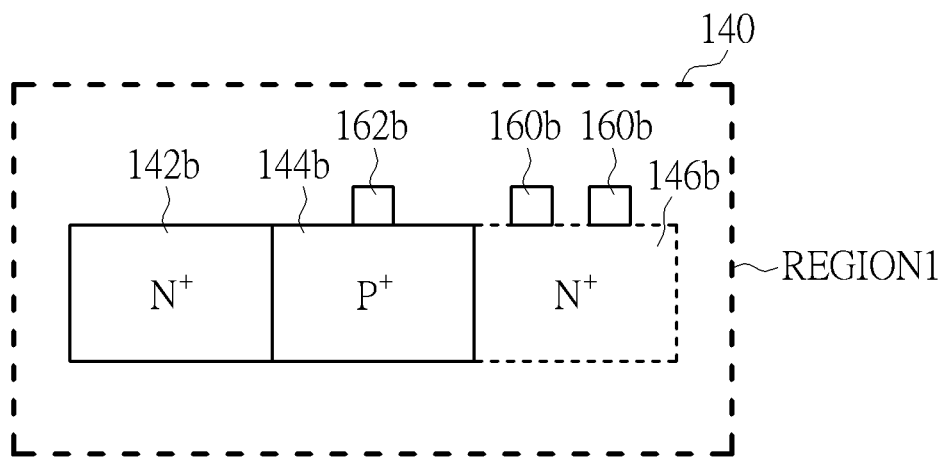
FIG. 3E is a schematic drawing illustrating the REGION 1 of a semiconductor device provided by a sixth preferred embodiment of the present invention.

Please refer to FIG. 3E, which illustrates REGION 1 provided by the sixth preferred embodiment. REGION 1 of the sixth preferred embodiment includes a first doped region 142$b$ having the first conductivity type, a second doped region 144$b$ having the second conductivity type, and a third doped region 146$b$ having the first conductivity type. It is noteworthy that a concentration of the third doped region 146$b$ is lower than a concentration of the first doped region 142$b$. Furthermore, the concentration of the third doped region 146$b$ can equal to or lower than a concentration of the drift region 150, even equal to a concentration of the deep well region 106. Thus the third doped region 146$b$ of the sixth preferred embodiment is depicted by a dotted line. In the sixth preferred embodiment for REGION 1, a plurality of first contacts 160$b$ are formed in the third doped region 146$b$ and electrically connected to the third doped region 146$b$, and at least a second contact 162$b$ is formed in the second doped region 144$b$ and electrically connected to the second doped region 144$b$.

Figure 4A:
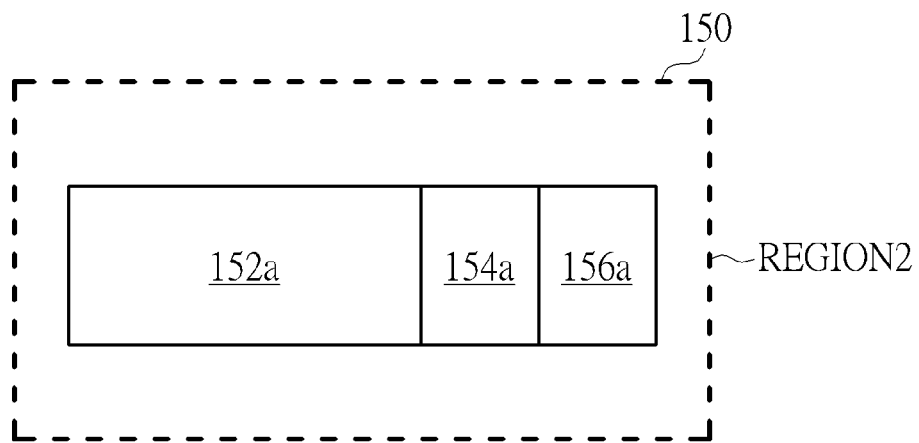
FIG. 4A is a schematic drawing illustrating the REGION 2 of a semiconductor device provided by a second preferred embodiment of the present invention.

Please refer to FIGS. 4A-4F, which are schematic drawings illustrating REGION 2 of a semiconductor device provided by a second to a seventh preferred embodiments of the present invention. It should be noted that REGION 2 of a semiconductor device provided by the first preferred embodiment has been described as aforementioned and thus is omitted for simplicity. As shown in FIG. 4A, REGION 2 in the second preferred embodiment of the present invention includes a first well region 152$a$, a second well region 154$a$ and a third well region 156$a$. The first well region 152$a$, the second well region 154$a$ and the third well region 156$a$ all include the first conductivity type. A concentration of the second well region 154$a$ and a concentration of the third well region 156$a$ is the same, but the concentrations of the second well region 154$a$ and the third well region 156$a$ are lower than a concentration of the first well region 152$a$. However, the concentrations of the second well region 154$a$ and the third well region 156$a$, and the concentration of the first well region 154$a$ are all higher than the concentration of the deep well region 106.

According to the semiconductor device 100 provided by the second preferred embodiment for REGION 2, the drift region 150 is formed by the first well region 152$a$ under the first doped region 142 and the isolation structure 112, the second well region 154$a$ under the second doped region 144, and the third well region 156$a$ under the third doped region 146. More important, the concentration of the second well region 154$a$ and the third well region 156$a$ are lower than the concentration of the first well region 152a, and thus resulted in an increased $R_{sub}$ in the drift region 150. Consequently, the trigger voltage of the semiconductor device 100 is reduced without impacting other specification such as the breakdown voltage of the semiconductor device 100.

Figure 4B:
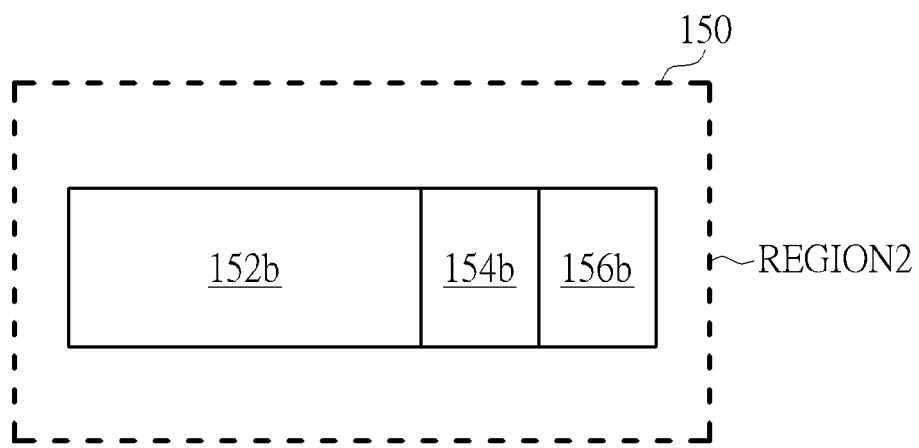
FIG. 4B is a schematic drawing illustrating the REGION 2 of a semiconductor device provided by a third preferred embodiment of the present invention.

Please refer to FIG. 4B, which illustrates REGION 2 provided by the third preferred embodiment. As shown in FIG. 4B, REGION 2 of the third preferred embodiment includes a first well region 152b, a second well region 154b and a third well region 156b. The first well region 152b, the second well region 154b and the third well region 156b all include the first conductivity type. A concentration of the second well region 154b and a concentration of the third well region 156b is the same, but the concentrations of the second well region 154b and the third well region 156b are lower than a concentration of the first well region 152b. More important, the concentrations of the second well region 154b and the third well region 156b are the same with the concentration of the deep well region 106.

According to the semiconductor device 100 provided by the third preferred embodiment for REGION 2, the drift region 150 is formed by the first well region 152b under the first doped region 142 and the isolation structure 112, the second well region 154b under the second doped region 144, and the third well region 156b under the third doped region 146. More important, the concentration of the second well region 154b and the third well region 156b are much lower than the concentration of the first region 152b, and thus resulted in an even increased $R_{sub}$ in the drift region 150. Consequently, the trigger voltage of the semiconductor device 100 is reduced without impacting other specification such as the breakdown voltage of the semiconductor device 100.

Figure 4C:
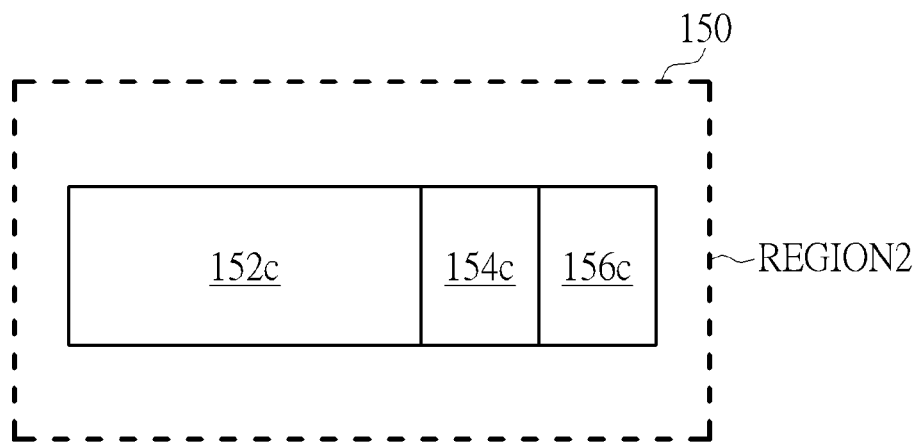
FIG. 4C is a schematic drawing illustrating the REGION 2 of a semiconductor device provided by a fourth preferred embodiment of the present invention.

Please refer to FIG. 4C, which illustrates REGION 2 of the fourth preferred embodiment of the present invention. As shown in FIG. 4C, REGION 2 of the fourth preferred embodiment includes a first well region 152c, a second well region 154c and a third well region 156c. The first well region 152c, the second well region 154c and the third well region 156c all include the first conductivity type. A concentration of the first well region 152c and a concentration of the third well region 156c is the same, and the concentrations of the first well region 152c and the third well region 156c are higher than a concentration of the second well region 154c. However, the concentration of the second well region 154c is higher than the concentration of the deep well region 106.

According to the semiconductor device 100 provided by the fourth preferred embodiment for REGION 2, the drift region 150 is formed by the first well region 152c under the first doped region 142 and the isolation structure 112, the second well region 154c under the second doped region 144, and the third well region 156c under the third doped region 146. More important, the concentration of the second well region 154c, which is sandwiched between the first well region 152c and the third well region 156c, is lower than the concentrations of the first well region 152c and the third well region 156c. Thus, an increased $R_{sub}$ is resulted in the drift region 150. Consequently, the trigger voltage of the semiconductor device 100 is reduced without impacting other specification such as the breakdown voltage of the semiconductor device 100.

Figure 4D:
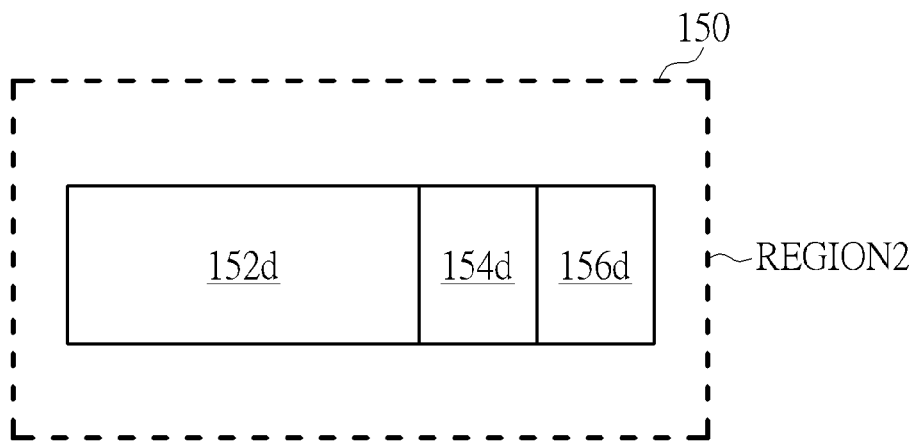
FIG. 4D is a schematic drawing illustrating the REGION 2 of a semiconductor device provided by a fifth preferred embodiment of the present invention.

Please refer to FIG. 4D, which illustrates REGION 2 of the fifth preferred embodiment of the present invention. As shown in FIG. 4D, REGION 2 of the fifth preferred embodiment includes a first well region 152d, a second well region 154d and a third well region 156d. The first well region 152d, the second well region 154d and the third well region 156d all include the first conductivity type. A concentration of the first well region 152d and a concentration of the second well region 154d is the same, and the concentrations of the first well region 152d and the second well region 154d are higher than a concentration of the third well region 156d. However, the concentration of the third well region 156d is higher than the concentration of the deep well region 106.

According to the semiconductor device 100 provided by the fifth preferred embodiment for REGION 2, the drift region 150 is formed by the first well region 152d under the first doped region 142 and the isolation structure 112, the second well region 154d under the second doped region 144, and the third well region 156d under the third doped region 146. More important, the concentrations of the first well region 152d and the second well region 154d are higher than the concentrations of the third well region 156d. Thus, an increased $R_{sub}$ is resulted in the drift region 150. Consequently, the trigger voltage of the semiconductor device 100 is reduced without impacting other specification such as the breakdown voltage of the semiconductor device 100.

Figure 4E:
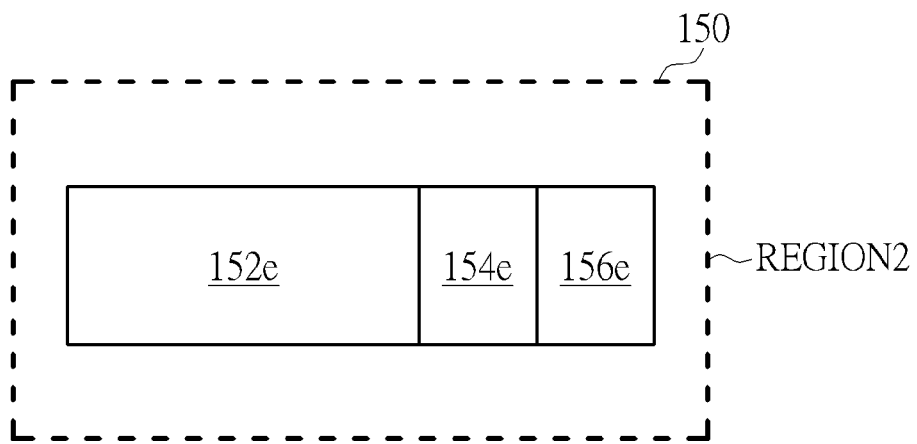
FIG. 4E is a schematic drawing illustrating the REGION 2 of a semiconductor device provided by an sixth preferred embodiment of the present invention.

Please refer to FIG. 4E, which illustrates REGION 2 of the sixth preferred embodiment of the present invention. As shown in FIG. 4E, REGION 2 of the sixth preferred embodiment includes a first well region 152e, a second well region 154e and a third well region 156e. The first well region 152e, the second well region 154e and the third well region 156e all include the first conductivity type. A concentration of the first well region 152e and a concentration of the second well region 154e is the same, and the concentrations of the first well region 152e and the second well region 154e are higher than a concentration of the third well region 156e. Furthermore, the concentration of the third well region 156e is the same with the concentration of the deep well region 106.

According to the semiconductor device 100 provided by the sixth preferred embodiment for REGION 2, the drift region 150 is formed by the first well region 152e under the first doped region 142 and the isolation structure 112, the second well region 154e under the second doped region 144, and the third well region 156e under the third doped region 146. More important, the concentrations of the first well region 152e and the second well region 154e are higher than the concentrations of the third well region 156e while the concentration of the third well region 156e is the same with the concentration of the deep well region 106. Thus, an increased $R_{sub}$ is resulted in the drift region 150. Consequently, the trigger voltage of the semiconductor device 100 is reduced without impacting other specification such as the breakdown voltage of the semiconductor device 100.

Figure 4F:
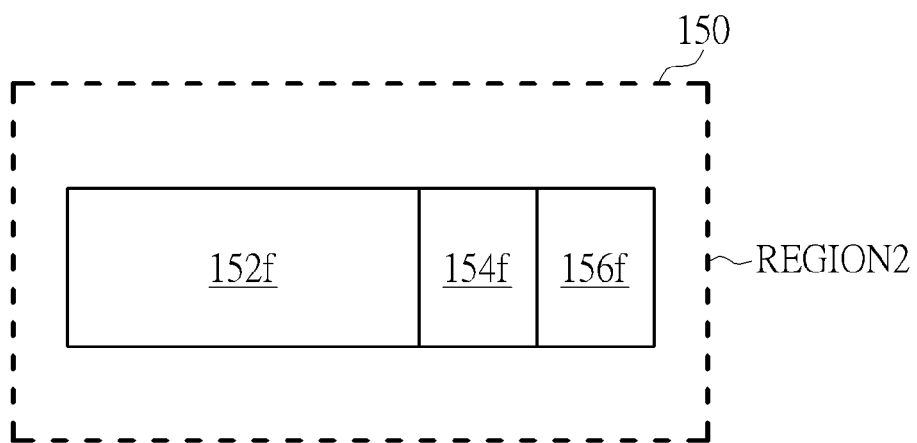
FIG. 4F is a schematic drawing illustrating the REGION 2 of a semiconductor device provided by a seventh preferred embodiment of the present invention.

Please refer to FIG. 4F, which illustrates REGION 2 of the seventh preferred embodiment of the present invention. As shown in FIG. 4F, REGION 2 of the seventh preferred embodiment includes a first well region 152f, a second well region 154f and a third well region 156f. The first well region 152f, the second well region 154f and the third well region 156f all include the first conductivity type. A concentration of the first well region 152f is different from the concentration of the second well region 154f and from the concentration of the third well region 156f. And the concentration of the second well region 154f and the concentration of the third well region 156f are both lower than the concentration of the first well region 152f. In detail, the concentration of the first well region 152f is higher than the concentration of the second well region 154f, the concentration of the second well region 154f is higher than the concentration of the third well region 156f, and the concentration of the third well region 156f can be equal to or higher than the concentration of the deep well region 106.

According to the semiconductor device 100 provided by the seventh preferred embodiment for REGION 2, the drift region 150 is formed by the first well region 152f under the first doped region 142 and the isolation structure 112, the second well region 154f under the second doped region 144, and the third well region 156f under the third doped region 146. More important, there are three different concentrations provided by the seventh preferred embodiment, and thus an increased $R_{sub}$ is resulted in the drift region 150. Consequently, the trigger voltage of the semiconductor device 100 is reduced without impacting other specification such as the breakdown voltage of the semiconductor device 100.

It should be easily realized that the semiconductor device 100 can be created by a combination of any one of the first to sixth preferred embodiments for REGION 1 and by any one of the first to seventh preferred embodiments for REGION 2.

According to the semiconductor devices provided by the present invention, the first well region, the second well region and the third well region, which construct the drift region, formed under the drain region include the same conductivity type, but the well regions include two or three different concentrations. That is, at least one of the second well region and the third well region comprises a concentration lower than a concentration of the first well region. It is found that $R_{sub}$ is conspicuously increased thereby, and thus the trigger voltage of the semiconductor device is desirably reduced. Consequently, the semiconductor device can be quickly turned on for rendering immediate ESD protection to the core circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   a gate positioned on the substrate;
   a drain region and a source region formed at two respective sides of the gate in the substrate, the drain region further comprising a first doped region having a first conductivity type, a second doped region having a second conductivity type, and a third doped region, the first conductivity type and the second conductivity type being complementary to each other;
   a first well region formed under the first doped region, the first well region comprising the first conductivity type;
   a second well region formed under the second doped region, the second well region comprising the first conductivity type; and
   a third well region formed under the third doped region, the third well region comprising the first conductivity type, wherein a concentration of the second well region is different from a concentration of the third well region.

2. The semiconductor device according to claim 1, wherein a concentration of the first well region is the same with the concentration of the third well region.

3. The semiconductor device according to claim 2, further comprising a deep well region formed in the substrate, the deep well region comprising the first conductivity type, and a concentration of the deep well region is lower than the concentration of the first well region and the third well region.

4. The semiconductor device according to claim 3, wherein the concentration of the second well region is the same with the concentration of the deep well region.

5. The semiconductor device according to claim 3, wherein the concentration of the second well region is lower than the concentration of the first well region and the third well region but higher than the concentration of the deep well region.

6. The semiconductor device according to claim 1, wherein a concentration of the first well region is the same with the concentration of the second well region.

7. The semiconductor device according to claim 6, further comprising a deep well region formed in the substrate, the deep well region comprising the first conductivity type, and a concentration of the deep well region is lower than the concentration of the first well region and the second well region.

8. The semiconductor device according to claim 7, wherein the concentration of the third well region is lower than the concentrations of the first well region and the second well region but higher than the concentration of the deep well region.

9. The semiconductor device according to claim 7, wherein the concentration of the third well region is the same with the concentration of the deep well region.

10. The semiconductor device according to claim 1, wherein a concentration of the first well region is different from the concentration of the second well region and from the concentration of the third well region.

11. The semiconductor device according to claim 10, wherein the concentration of the second well region and the concentration of the third well region are both lower than the concentration of the first well region.

12. The semiconductor device according to claim 1, wherein the third doped region comprises the first conductivity type, and a concentration of the third doped region is the same with or lower than a concentration of the first doped region.

13. The semiconductor device according to claim 12, further comprising at least a first contact electrically connected to the third doped region.

14. The semiconductor device according to claim 13, further comprising at least a second contact electrically connected to the second doped region.

15. The semiconductor device according to claim 1, wherein the third doped region comprises the second conductivity type.

16. The semiconductor device according to claim 15, further comprising at least a first contact electrically connected to the third doped region.

17. The semiconductor device according to claim 16, further comprising at least a second contact electrically connected to the second doped region.

18. A semiconductor device comprising:
    a substrate;
    a gate positioned on the substrate;
    a drain region and a source region formed at two respective sides of the gate in the substrate, the drain region further comprising a first doped region having a first conductivity type, a second doped region having a second conductivity type, and a third doped region, and the first conductivity type and the second conductivity type being complementary to each other;
    a first well region formed under the first doped region, the first well region comprising the first conductivity type;
    a second well region formed under the second doped region, the second well region comprising the first conductivity type; and
    a third well region formed under the third doped region, the third well region comprising the first conductivity type, wherein a concentration of the second well region is the same with a concentration of the third well region, and the concentrations of the second well region and the third well region are different from a concentration of the first well region.

19. The semiconductor device according to claim 18, further comprising a deep well region formed in the substrate, the deep well region comprises the first conductivity type, and a concentration of the deep well region is lower than the concentration of the first well region.

20. The semiconductor device according to claim 19, wherein the concentrations of the second well region and the third well region are lower than the concentration of the first well region but higher than the concentration of the deep well region.

21. The semiconductor device according to claim 19, wherein the concentrations of the second well region and the third well region are the same with the concentration of the deep well region.

22. The semiconductor device according to claim 18, wherein the third doped region comprises the first conductivity type, and a concentration of the third doped region is the same with or lower than a concentration of the first doped region.

23. The semiconductor device according to claim 22, further comprising at least a first contact electrically connected to the third doped region.

24. The semiconductor device according to claim 23, further comprising at least a second contact electrically connected to the second doped region.

25. The semiconductor device according to claim 18, wherein the third doped region comprises the second conductivity type.

26. The semiconductor device according to claim 25, further comprising at least a first contact electrically connected to the third doped region.

27. The semiconductor device according to claim 26, further comprising at least a second contact electrically connected to the second doped region.

28. A semiconductor device comprising:
a substrate;
a gate positioned on the substrate;
a drain region and a source region formed at two respective sides of the gate in the substrate, the drain region further comprising a first doped region having a first conductivity type, a second doped region having a second conductivity type, and a third doped region, and the first conductivity type and the second conductivity type being complementary to each other;
a first well region formed under the first doped region, the first well region comprising the first conductivity type;
a second well region formed under the second doped region, the second well region comprising the first conductivity type; and
a third well region formed under the third doped region, the third well region comprising the first conductivity type,
wherein at least one of the second well region and the third well region comprises a concentration lower than a concentration of the first well region.

* * * * *